US009240305B2

(12) United States Patent
Ominami et al.

(10) Patent No.: US 9,240,305 B2
(45) Date of Patent: Jan. 19, 2016

(54) CHARGED PARTICLE BEAM DEVICE AND SAMPLE OBSERVATION METHOD

(71) Applicant: Hitachi High-Technologies Corporation, Minato-ku, Tokyo (JP)

(72) Inventors: Yusuke Ominami, Tokyo (JP); Hiroyuki Suzuki, Tokyo (JP); Shinsuke Kawanishi, Tokyo (JP); Masahiko Ajima, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/422,186

(22) PCT Filed: Jul. 3, 2013

(86) PCT No.: PCT/JP2013/068201
§ 371 (c)(1),
(2) Date: Feb. 18, 2015

(87) PCT Pub. No.: WO2014/041876
PCT Pub. Date: Mar. 20, 2014

(65) Prior Publication Data
US 2015/0235803 A1 Aug. 20, 2015

(30) Foreign Application Priority Data

Sep. 14, 2012 (JP) ................................. 2012-202188

(51) Int. Cl.
*H01J 37/26* (2006.01)
*H01J 37/20* (2006.01)
(Continued)

(52) U.S. Cl.
CPC ................. *H01J 37/20* (2013.01); *H01J 37/18* (2013.01); *H01J 37/261* (2013.01); *H01J 2237/20* (2013.01); *H01J 2237/2605* (2013.01)

(58) Field of Classification Search
USPC .................... 250/306, 307, 309–311, 440.11, 250/441.11, 442.11, 492.1, 492.2, 492.3, 250/526; 356/244, 256
See application file for complete search history.

(56) References Cited

U.S. PATENT DOCUMENTS 6,812,472 B2 * 11/2004 Takekoshi ............. H01L 21/682
250/441.11
8,105,265 B2 * 1/2012 Demers ................. A61M 1/106
210/739
(Continued)

FOREIGN PATENT DOCUMENTS

JP  59-146145 A  8/1984
JP  11-162388 A  6/1999
(Continued)

OTHER PUBLICATIONS

International Search Report (PCT/ISA/210) dated Aug. 27, 2013, with English translation (four (4) pages).

*Primary Examiner* — Bernard E Souw
(74) *Attorney, Agent, or Firm* — Crowell & Moring LLP

(57) ABSTRACT

All of the conventional charged particle beam devices are designed only for the observation at atmospheric pressure or in gas atmosphere at a pressure substantially equal to the atmospheric pressure, and there is no device enabling easy observation using a typical high-vacuum charged particle microscope at atmospheric pressure or in gas atmosphere at a pressure substantially equal to the atmospheric pressure. Such a conventional technique has another problem that the distance between the diaphragm and a sample cannot be controlled, and so it has a high risk of breakage of the diaphragm. Then, the device of the present invention includes a diaphragm configured to separate a space to place a sample therein so that pressure of the space to place the sample therein is kept larger than pressure of the interior of the enclosure, the diaphragm letting the primary charged particle beam transmit or pass therethrough and being removable; a contact prevention member configured to prevent a contact between the sample and the diaphragm; and an adjustment mechanism configured to let at least a part of the contact prevention member in an optical axis direction of the charged particle optic column.

17 Claims, 12 Drawing Sheets

(51) Int. Cl.
*H01J 37/16* (2006.01)
*G01N 23/02* (2006.01)
*G01N 21/01* (2006.01)
*H01J 37/18* (2006.01)

(56) References Cited

U.S. PATENT DOCUMENTS

| | | | | |
|---|---|---|---|---|
| 8,979,788 | B2* | 3/2015 | Demers | A61M 1/106 |
| | | | | 210/739 |
| 2004/0007677 | A1* | 1/2004 | Takekoshi | H01L 21/682 |
| | | | | 250/492.2 |
| 2009/0099498 | A1* | 4/2009 | Demers | A61M 1/106 |
| | | | | 604/6.09 |
| 2009/0166536 | A1 | 7/2009 | Suga et al. | |
| 2012/0130298 | A1* | 5/2012 | Demers | A61M 1/106 |
| | | | | 604/6.1 |
| 2013/0313430 | A1 | 11/2013 | Ominami et al. | |
| 2015/0228449 | A1* | 8/2015 | Kawanishi | H01J 37/16 |
| | | | | 250/307 |
| 2015/0255244 | A1* | 9/2015 | Ominami | H01J 37/16 |
| | | | | 250/307 |

FOREIGN PATENT DOCUMENTS

| | | |
|---|---|---|
| JP | 2007-324099 A | 12/2007 |
| JP | 2008-218342 A | 9/2008 |
| JP | 2009-158222 A | 7/2009 |
| WO | WO 2012/104942 A1 | 8/2012 |

* cited by examiner

Fig. 3
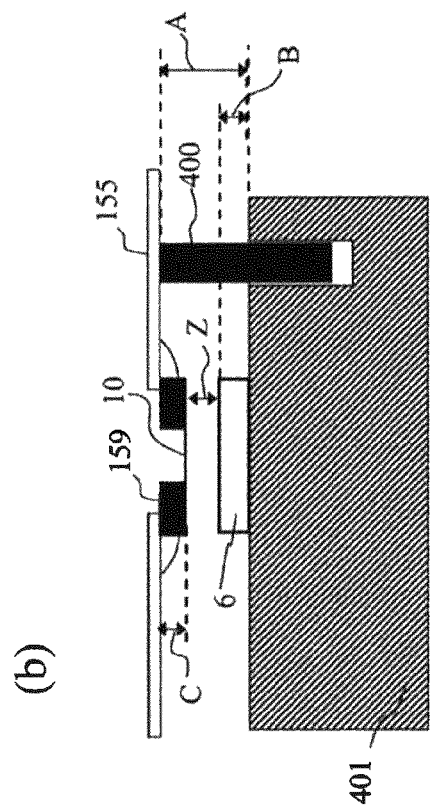
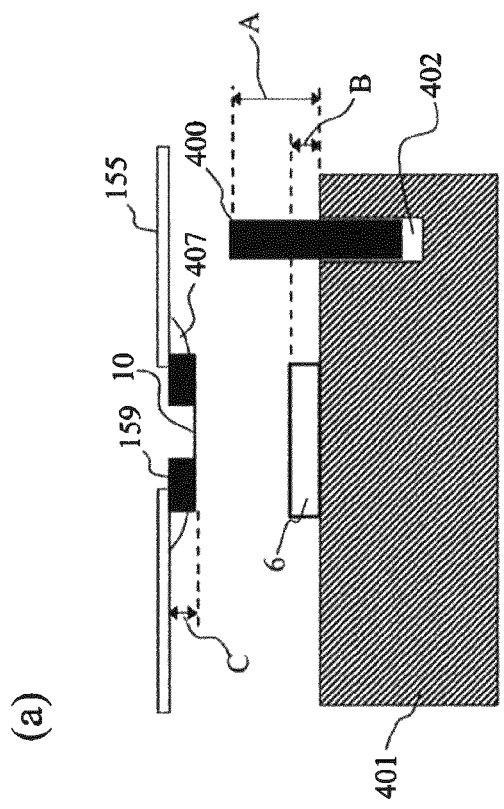

Fig. 4
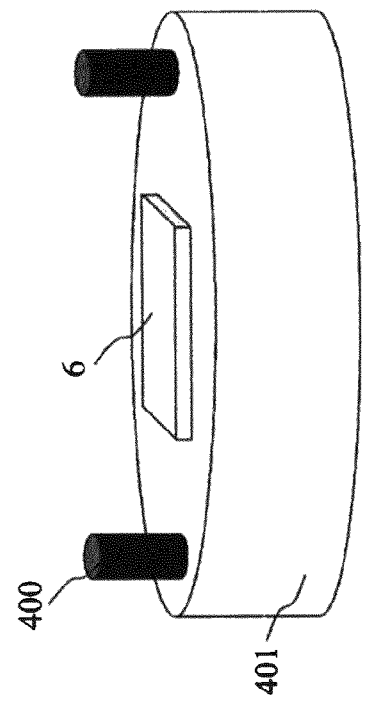
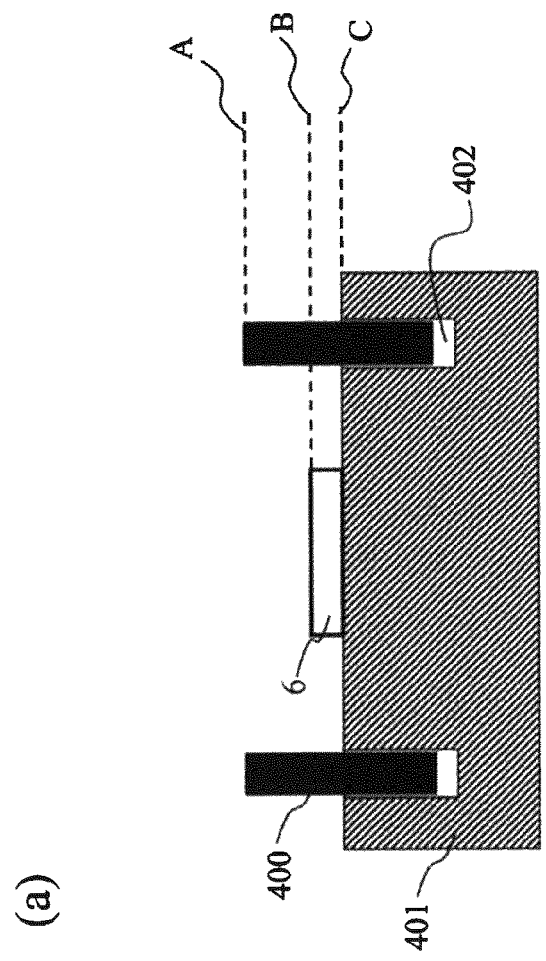

CHARGED PARTICLE BEAM DEVICE AND SAMPLE OBSERVATION METHOD

TECHNICAL FIELD

The present invention relates to a charged particle beam device enabling observation of a sample at atmospheric pressure or a predetermined pressure.

BACKGROUND ART

For the purpose of observation of a micro region of an object, electron scanning electron microscopes (SEMs) and transmission electron microscopes (TEMs) are used, for example. These devices are typically configured to evacuate an enclosure thereof in which a sample is to be placed and then to image the sample in the vacuum atmosphere. Some samples such as biological and chemical samples and liquid samples, however, may be damaged with the vacuum or may change in state. Meanwhile there is a great need for observation of such samples with electron microscopes, and so SEM apparatuses and sample holding devices enabling the observation of a sample to be observed at atmospheric pressure have been developed recently.

These devices are designed on the principle of providing a diaphragm or a small aperture between an electron optical system and a sample so as to let an electron beam pass therethrough, thus partitioning the vacuum state and the atmospheric state, and they are common in including a diaphragm between a sample and an electron optical system.

Patent Literature 1, for example, discloses a SEM including an electron optic column disposed so that the electron source side thereof is directed downward and the objective lens side thereof is directed upward, and a diaphragm disposed above the exit aperture of an electron beam at the end of the electron optic column via an O ring so as to transmit an electron beam. In the invention described in this literature, a sample to be observed is directly placed on the diaphragm, a primary electron beam is applied to the sample from the lower surface thereof, and reflected electrons or secondary electrons are detected for SEM observation. A sample is held in a space defined with an annular member disposed around the diaphragm and the diaphragm, and this space is filled with liquid such as water.

CITATION LIST

Patent Literature

Patent Literature 1: JP 2009-158222 A (US 2009/0166536 A1)

SUMMARY OF INVENTION

Technical Problem

All of such conventional charged particle beam devices are designed only for the observation at atmospheric pressure or in gas atmosphere at a pressure substantially equal to the atmospheric pressure, and there is no device enabling easy observation using a typical high-vacuum charged particle microscope at atmospheric pressure or in gas atmosphere at a pressure substantially equal to the atmospheric pressure.

For instance, the SEM described in Patent Literature 1 has a highly specific structure, with which typical SEM observation in the high-vacuum atmosphere cannot be performed.

In the case of such a conventional technique, there is another problem that the distance between the diaphragm and a sample cannot be controlled, and so it has a high risk of breakage of the diaphragm.

In view of such problems, the present invention aims to provide a charged particle beam device enabling observation of a sample in the air atmosphere or gas atmosphere without greatly changing the configuration of a conventional high-vacuum charged particle microscope.

Solution to Problem

To solve the above problems, the configuration defined in claims is used, for example.

The present application includes a plurality of means to solve the aforementioned problems, and one example of them includes an adjustment mechanism configured to let at least a part of a contact prevention member movable in an optical axis direction of the charged particle optic column, the contact prevention member being configured to prevent a contact between a sample and a removable diaphragm capable of letting a primary charged particle beam transmit or pass therethrough.

Advantageous Effects of Invention

The present invention can provide a charged particle beam device enabling observation of a sample in the air atmosphere or gas atmosphere without greatly changing the configuration of a conventional high-vacuum charged particle microscope, and enabling observation while keeping the sample in a non-contact state with the diaphragm.

Problems, configurations, and advantageous effects other than those described above will be made clear by the following description of embodiments.

BRIEF DESCRIPTION OF DRAWINGS

FIG. 3 describes a contact prevention member.
FIG. 4 describes another contact prevention member.

DESCRIPTION OF EMBODIMENTS

The following describes embodiments, with reference to the drawings.

The following exemplifies a charged particle beam microscope as one example of the charged particle beam devices. Note here that this is just one example of the present invention, and the present invention is not limited to the embodiments described below. The present invention is applicable to scanning electron microscopes, scanning ion microscopes, scanning transmission electron microscopes, a composite device including them and a sample processing device, or analyzers/inspection devices as applications thereof as well.

In the present specification, the "atmospheric pressure" means air atmosphere or predetermined gas atmosphere that is in pressure environment at atmospheric pressure, at somewhat negative pressure or in the pressurized state. Specifically it includes the pressure from about $10^5$ Pa (atmospheric pressure) to about $10^3$ Pa.

Embodiment 1

Figure 1:
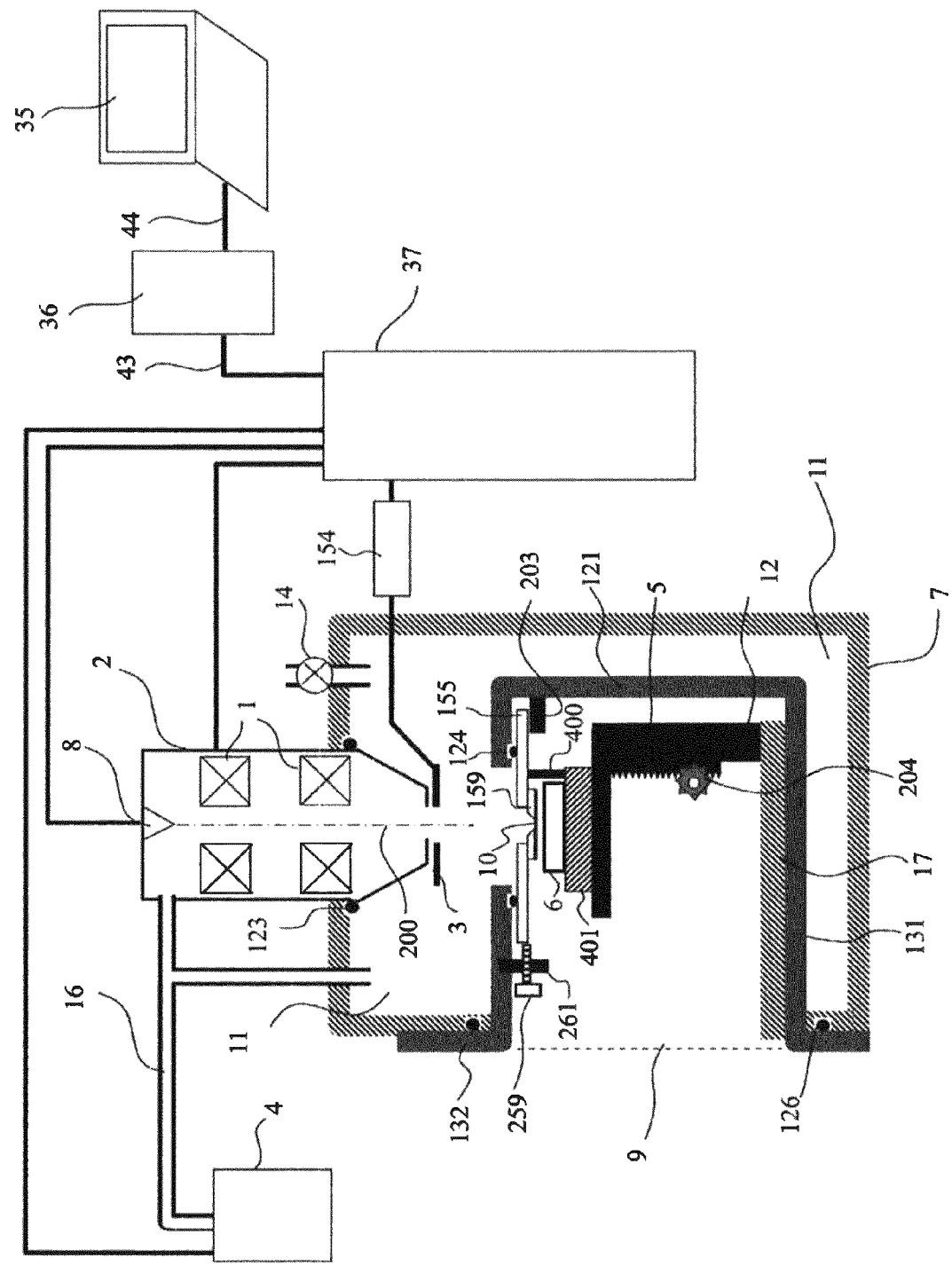
FIG. 1 illustrates the overall configuration of a charged particle microscope of Embodiment 1.

The present embodiment describes a basic embodiment. FIG. 1 illustrates the overall configuration of a charged particle microscope of the present embodiment. The charged particle microscope illustrated in FIG. 1 mainly includes a charged particle optic column 2, a first enclosure 7 (hereinafter this may be called a vacuum chamber) to support the charged particle optic column at a device installation face, a second enclosure 121 (hereinafter this may be called an attachment) that is inserted into the first enclosure 7 for use, and a control system to control them. During the operation of the charged particle microscope, the interior of the charged particle optic column 2 and the first enclosure 7 are evacuated with a vacuum pump 4. Activation and stop operations of the vacuum pump 4 also are controlled by the control system. This drawing illustrates one vacuum pump 4 only, which may be two or more.

The charged particle optic column 2 includes elements such as a charged particle source 8 that generates a charged particle beam, and an optical lens 1 configured to focus the generated charged particle beam and guide the same to the lower part of the column, and then scan a sample 6 with the beam as a primary charged particle beam. The charged particle optic column 2 is disposed to stick out to the interior of the first enclosure 7, and is fixed to the first enclosure 7 via a vacuum sealing member 123. At the end of the charged particle optic column 2, a detector 3 is disposed so as to detect secondary charged particles (secondary electrons or reflected electrons) obtained from the irradiation with such primary charged particle beam.

The charged particle microscope of the present embodiment includes, as the control system, a computer 35 that a user of the device uses, an upper-level control unit 36 connected to the computer 35 for communication, and a lower-level control unit 37 that controls the evacuation system, the charged particle optical system and the like in accordance with an instruction from the upper-level control unit 36. The computer 35 includes a monitor on which the manipulation screen (GUI) of the device is displayed, and inputting means for the manipulation screen, such as a keyboard and a mouse. The upper-level control unit 36, the lower-level control unit 37 and the computer 35 are connected with each other via communication lines 43 and 44.

The lower-level control unit 37 is a part to transmit/receive a control signal to control the vacuum pump 4, the charged particle source 8, the optical lens 1 and the like, and to convert an output signal from the detector 3 into digital image signals and transmit them to the upper-level control unit 36. In the drawing, an output signal from the detector 3 is connected to the lower-level control unit 37 via an amplifier 154 such as a preamplifier. If such an amplifier is not required, it can be omitted.

The upper-level control unit 36 and the lower-level control unit 37 may include the mixture of an analog circuit and a digital circuit, or the upper-level control unit 36 and the lower-level control unit 37 may be integrated into one. Note here that the configuration of the control system illustrated in FIG. 1 is just one example, and modification examples of the control unit, valves, the vacuum pump, wiring for communication, and the like will belong to the scope of the charged particle beam microscope of the present embodiment as long as they meet the functions intended for the present embodiment.

To the first enclosure 7, an evacuation pipe 16 is connected, having one end connected to the vacuum pump 4 so that the interior of the first enclosure can be kept in the vacuum state. The first enclosure is provided with a leak valve 14 as well so as to let the interior of the enclosure open to the air, and so the interior of the first enclosure 7 can be open to the air during maintenance, for example. The leak valve 14 may be omitted, or two or more of such leak valves may be provided. The position of the leak valve 14 disposed at the first enclosure 7 is not limited to the position illustrated in FIG. 1, and the leak valve may be disposed at another position on the first enclosure 7. The first enclosure 7 has an opening at a side face thereof, through which the second enclosure 121 is inserted.

The second enclosure 121 is made up of a rectangular parallelepiped shaped main body part 131 and an abutting part 132. As described later, at least one side face of the side faces of the rectangular parallelepiped shape of the main body part 131 defines an open face 9. The faces of the side faces of the rectangular parallelepiped shape of the main body part 131 other than the face on which a diaphragm holding member 155 is to be disposed may be walls of the second enclosure 121, or the second enclosure 121 itself does not have walls, and in the state where the second enclosure is assembled into the first enclosure 7, side walls of the first enclosure 7 define the walls. The position of the second enclosure 121 is fixed with reference to the side faces or inner wall faces of the first enclosure 7 or to the charged particle optic column. The main body part 131 is inserted into the interior of the first enclosure 7 via the aforementioned opening part, and when it is assembled into the first enclosure 7, the main body part has a function to accommodate a sample 6 to be observed. The abutting part 132 defines the abutting faces with the outer wall face of the first enclosure 7 on the side of the side face where the opening part is provided, and is fixed to the outer wall face on the side of the side face via a vacuum sealing member 126. This means the second enclosure 121 as a whole fitted into the first enclosure 7. Such an opening part can be manufactured in the simplest way by using an opening for import and export of a sample that is originally provided at a sample vacuum chamber of a charged particle microscope. That is, the second enclosure 121 may be manufactured so as to match with the size of the hole that is originally provided, and then the vacuum sealing member 126 may be attached around the hole, whereby modification of the device can be made minimum. The second enclosure 121 can be detached from the first enclosure 7.

On the upper face side of the second enclosure 121, a diaphragm 10 is disposed at a position immediately below the charged particle optic column 2 when the second enclosure 121 as a whole is fitted into the first enclosure 7. This diaphragm 10 transmits or lets a primary charged particle beam pass therethrough, the primary charged particle beam being emitted from the lower end of the charged particle optic column 2, and the primary charged particle beam finally reaches the sample 6 via the diaphragm 10.

When the charged particle beam reaches the sample 6, then a secondary charged particle beam such as reflected charged particles or transmitted charged particles is emitted from the interior or the surface of the sample. These secondary charged particles are detected by the detector 3. Since the detector 3 is located on the sample face side irradiated with the charged particles, information on the sample surface can be acquired. The detector 3 may be a detection element capable of detecting charged particles coming with energy of several keV to several tens keV. This detection element further may include amplification means of a signal. It is preferable in terms of the demand for the device configuration that this detection element be thin and flat. For instance, this may be a semiconductor detector made of a semiconductor material such as silicon or a scintillator capable of converting a charged particle signal into light at the glass surface or the interior thereof, for example.

As illustrated in FIG. 1, side faces of the second enclosure 121 include the open face 9 that is in communication with the atmospheric space in at least a size enabling import and export of a sample, and the sample 6 to be stored in the interior (right side with reference to the broken line of the drawing, hereinafter called a second space) of the second enclosure 121 will be placed in the atmospheric pressure state during the observation. Note here that FIG. 1 is a cross-sectional view of the device in the direction parallel to the optical axis, and so only one face is illustrated for the open face 9. However, when vacuum sealing is implemented with the side faces of the first enclosure in the depth direction and the front direction of the sheet, the open face 9 of the second enclosure 121 is not limited to one face. At least one face may be provided for the opening face in the state where the second enclosure 121 is assembled into the first enclosure 7. Meanwhile, the vacuum pump 4 is connected to the first enclosure 7, and a closer space (hereinafter called a first space) defined with the inner wall faces of the first enclosure 7, the outer wall faces of the second enclosure and the diaphragm 10 can be evacuated. The diaphragm is disposed so that the pressure of the second space is kept larger than the pressure of the first space, whereby the second space can be separated in terms of pressure in the present embodiment. That is, the diaphragm 10 keeps the first space 11 at high vacuum, while keeping the second space 12 at atmospheric pressure or in gas atmosphere having a pressure substantially equal to the atmospheric pressure, and so the charged particle optic column 2 and the detector 3 can be kept in the vacuum state during the operation of the device, and the sample 6 can be kept at the atmospheric pressure.

Figure 2:
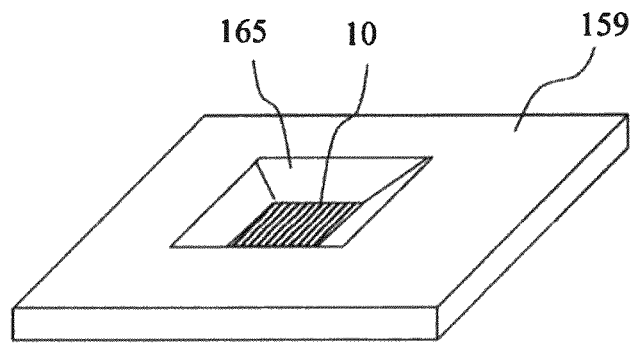
FIG. 2 illustrates the details of a diaphragm.

FIG. 2 illustrates the details of the diaphragm 10. The diaphragm 10 is prepared by deposition or vapor deposition on a base 159. The diaphragm 10 may be made of a carbon material, an organic material, silicon nitride, silicon carbide, silicon oxide or the like. The base 159 may be a member made of silicon, for example, at which a tapered hole 165 is bored as in the drawing by processing such as wet-etching, and the diaphragm 10 is disposed at the lower face of the hole in FIG. 2. The diaphragm 10 part may be multiple windows disposed at a plurality of positions. The thickness of the diaphragm enabling transmission or passage of a primary charged particle beam is about several nm to several μm. Instead of the diaphragm, an aperture member having a through-hole for a primary charged particle beam may be used, and in that case, the size of the through-hole is desirably about 1 mm² or lower in terms of the practical ability of differential evacuation with a vacuum pump. When the charged particle beam is made up of ions, it is difficult to let such a beam pass through without generating a breakage of the diaphragm. In that case, an aperture of about 1 mm² in area or less may be used. The position of the diaphragm 10 is adjusted so that the center of the diaphragm 10 agrees with the optical axis (the alternate long and short dash line in FIG. 1) of the charged particle optic column 2. This means that the diaphragm 10 and the optical axis (the alternate long and short dash line in FIG. 1) of the charged particle optic column 2 are disposed coaxially. The distance between the sample 6 and the diaphragm 10 is adjusted by placing a sample base 17 having an appropriate height. Herein, when the diaphragm 10 part includes multiple windows disposed at a plurality of positions, breakage will likely occur because the sample touches the diaphragm. To avoid this, the diaphragm 10 may be disposed only at one position.

The diaphragm is required not to break at a differential pressure for the separation between the atmospheric pressure and the vacuum. To this end, the diaphragm 10 has an area of about several tens μm to several mm at a maximum. The diaphragm 10 may have a shape such as a rectangular shape instead of a square shape. It may have any shape. The side illustrated in FIG. 2, i.e., the side having the tapered part 165 is disposed on the vacuum side (upper side in the drawing). This is for the effective detection of secondary charged particles emitted from a sample with the detector 3.

The conventional techniques of an environmental cell capable of keeping a part locally at the air atmosphere enable the observation at the atmospheric pressure/gas atmosphere. However, such techniques have a problem that they enable the observation of a sample having a size that can be inserted into a cell only, and so a large sample cannot be observed at the atmospheric pressure/gas atmosphere. As another problem, when different samples are to be observed with an environmental cell, the environmental cell has to be taken out from the sample vacuum chamber of the SEM for replacement with another sample, and then such a cell has to be brought into the sample vacuum chamber again, meaning the complicated process for sample replacement. On the other hand, according to the scheme of the present embodiment, one side face of the second enclosure 121 is open, and the sample 6 is placed in the second space 12 that is a wide atmospheric-pressure space, and so a large sample such as a semiconductor well also can be observed at atmospheric pressure. Especially the second enclosure of the present embodiment is configured to be inserted from the side face of the sample chamber, and so it can be easily increased in size. This enables the observation of a large sample that cannot be enclosed in an environmental cell. Further, since the second enclosure 121 has an open face, the sample can be moved between the interior and the exterior of the second space 12, and so the sample can be replaced easily.

In the case of the conventional technique to hold a sample above the diaphragm filled with liquid, the sample becomes wet after the atmospheric-pressure observation, and so it is very difficult to observe a sample in the same state at both of air atmosphere and high-vacuum atmosphere. Further since liquid is always in contact with the diaphragm, it has another problem that the risk of breakage of the diaphragm is very high. On the other hand, according to the scheme of the present embodiment, since the sample 6 is disposed in a non-contact state with the diaphragm 10, it can be observed under both of the high-vacuum or the atmospheric pressure without changing the state of the sample. Further since the sample is not placed on the diaphragm, the risk of breakage of the diaphragm with the sample can be reduced.

After passing through the diaphragm, the charged particle beam is scattered in the atmospheric space. At atmospheric pressure, a charged particle beam has a very short mean free path. That is, it is desirable that the distance between the diaphragm 10 and the sample 6 be as short as possible. Specifically, it has to be about 1,000 μm or shorter. In this case, however, when the diaphragm 10 and the sample 6 are brought closer, if the diaphragm 10 and the sample 6 come into contact erroneously, the diaphragm 10 may be broken.

To avoid this, the present embodiment is provided with a contact prevention member that prevents a contact of the diaphragm 10 with the sample 6. Referring to FIG. 3, the following describes the contact prevention member. For simplification of the description, the drawing illustrates the part surrounding the diaphragm and the part surrounding the sample only. The present embodiment is provided with a contact prevention member 400 between the sample 6 and the diaphragm 10. The contact prevention member is provided so as to protrude from the sample base, and as illustrated in FIG. 3(a), the forward end of the contact prevention member 400 is disposed always closer to the diaphragm than the sample 6. Then as illustrated in FIG. 3(b), when a sample base 401 is brought closer to the diaphragm 10, the contact prevention member 400 comes into contact with the diaphragm holding member 155, thus preventing a contact of the diaphragm 10 with the sample 6. The height B of the sample 6 may vary with the sample. Then, an adjustment mechanism has to be provided so as to adjust the height A of the contact prevention member 400 in accordance with the height sample B. To this end, the contact prevention member 400 may be a male screw, and the side of the sample base 401 may be a female screw 402, for example, whereby rotation of the screw part of the contact prevention member 400 can change the height A of the contact prevention member 400. The adjustment mechanism may be any one as long as the position of the contact prevention member 400 where the sample and the diaphragm come into contact can be changed in the direction of the optical axis of the charged particle optic column.

The distance Z between the diaphragm and the sample will be represented by the following expression when the contact prevention member 400 comes into contact with the diaphragm holding member 155, where B denotes the distance from the sample base 401 to the sample and C denotes the distance between the diaphragm holding member 155 and the diaphragm 10.

$$Z=(A-B)-C \qquad \text{[Expression 1]}$$

As described above, from the viewpoint of the mean free path of a charged particle beam, the distance Z between the diaphragm and the sample is short that is 1,000 μm or less. Further in order to prevent a contact of the diaphragm 10 with the sample 6, the following expression has to hold.

$$Z=A-B>C \qquad \text{[Expression 2]}$$

The drawing illustrates the state of providing a vacuum sealing member 407 for vacuum sealing between the diaphragm holding member 155 and the diaphragm 10. The vacuum sealing member 407 may be an adhesive or a double-faced tape, for example. When such a vacuum sealing member is present between the diaphragm holding member 155 and the diaphragm 10, the distance C stated above may be distance that is the total of the thicknesses of the vacuum sealing member between the diaphragm holding member 155 and the diaphragm 10 and the diaphragm 10.

When each distance A, B or C is unknown, such distances A, B and C can be measured using an instrument enabling the measurement of a height of the sample base 401 on which the sample 6 is placed and the diaphragm holding member 155 holding the diaphragm 10 at the outside of the device using laser or light. When the sample 6 and the diaphragm 10 used have always the same height, once the distance A from the sample base 401 to the contact prevention member 400 is determined, there is no need to adjust the contact prevention member 400 again. As stated above, the contact prevention member has another advantageous effect of keeping the distance from the diaphragm to the surface of the sample constant because the contact prevention member is kept in contact with the diaphragm holding member.

A series of the flow from the sample placing to the irradiation with a charged particle beam is described below. Firstly, the sample 6 is placed on the sample base 401. Next, the contact prevention member 400 is inserted to the female screw 402. Herein, the distance from the surface of the sample 6 to the upper part of the contact prevention member 400 becomes the term (A–B) indicated in [Expression 1] or [Expression 2]. As described above, when the distance (AB) is to be known precisely, it may be measured or recorded using an instrument enabling the measurement of the height using laser or light. Next, the sample base on which the contact prevention member 400 and the sample 6 are provided is disposed on a sample stage 5 immediately below the diaphragm 10. Next, the diaphragm 10 and the sample 6 are brought closer to each other using the sample stage 5 so as to bring the contact prevention member 400 into contact with the diaphragm holding member 155. This enables the irradiation of the sample 6 with a charged particle beam via the diaphragm 10. The irradiation with a charged particle beam may be performed prior to the bringing the sample 6 closer. When the contact prevention member 400 and the diaphragm holding member 155 come into contact, the diaphragm holding member 155 moves, and so such a contact can be recognized by observation with the charged particle beam irradiation.

FIG. 4 illustrates an example including a plurality of the contact prevention members 400. FIG. 4(a) is a cross-sectional view of a side face, and FIG. 4(b) is a perspective view. FIG. 3 shows only one contact prevention member 400, which may be disposed at two positions as illustrated in FIG. 4. Such disposition at two positions can reduce the risk that the diaphragm 10 and the sample 6 come into contact erroneously when the sample base is inclined with respect to the diaphragm as compared with disposition at only one position.

Figure 5:
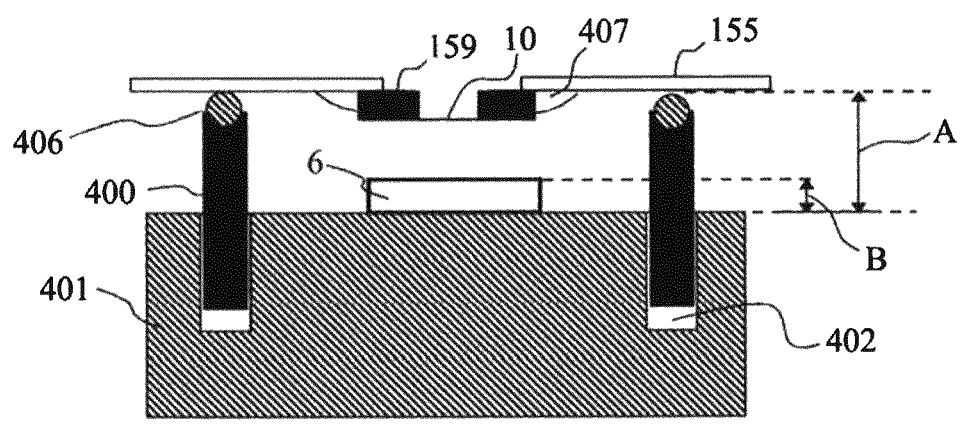
FIG. 5 describes still another contact prevention member.

As illustrated in FIG. 5, a ball bearing 406 may be disposed on the contact prevention member 400. In this case, this ball bearing 406 will come into contact with the diaphragm holding member 155. When such a ball bearing 406 is disposed at the forward end of the contact prevention member 400, a sample can be moved in the horizontal direction or in the sheet face direction of the drawing while keeping the contact prevention member 400 in contact with the diaphragm holding member 155. Herein any structure can be used as long as the sample base can be driven in the direction orthogonal to the optical axis of the charged particle optic column while keeping a constant distance between the sample base and the diaphragm holding member 155 (or the distance between the sample surface and the diaphragm) by the contact prevention member 400, which is not limited to the ball bearing. Such a member is called a fine adjustment member. When friction between the contact prevention member 400 and the diaphragm holding member 155 is small, this fine adjustment member may be a member other than the ball bearing. For instance, a material such as organic materials such as fluorine resin including polytetrafluoroethylene, which has a small coefficient of friction can be used, or a contact area may be made minimum for better sliding between the contact prevention member 400 and the diaphragm holding member 155.

Figure 6:
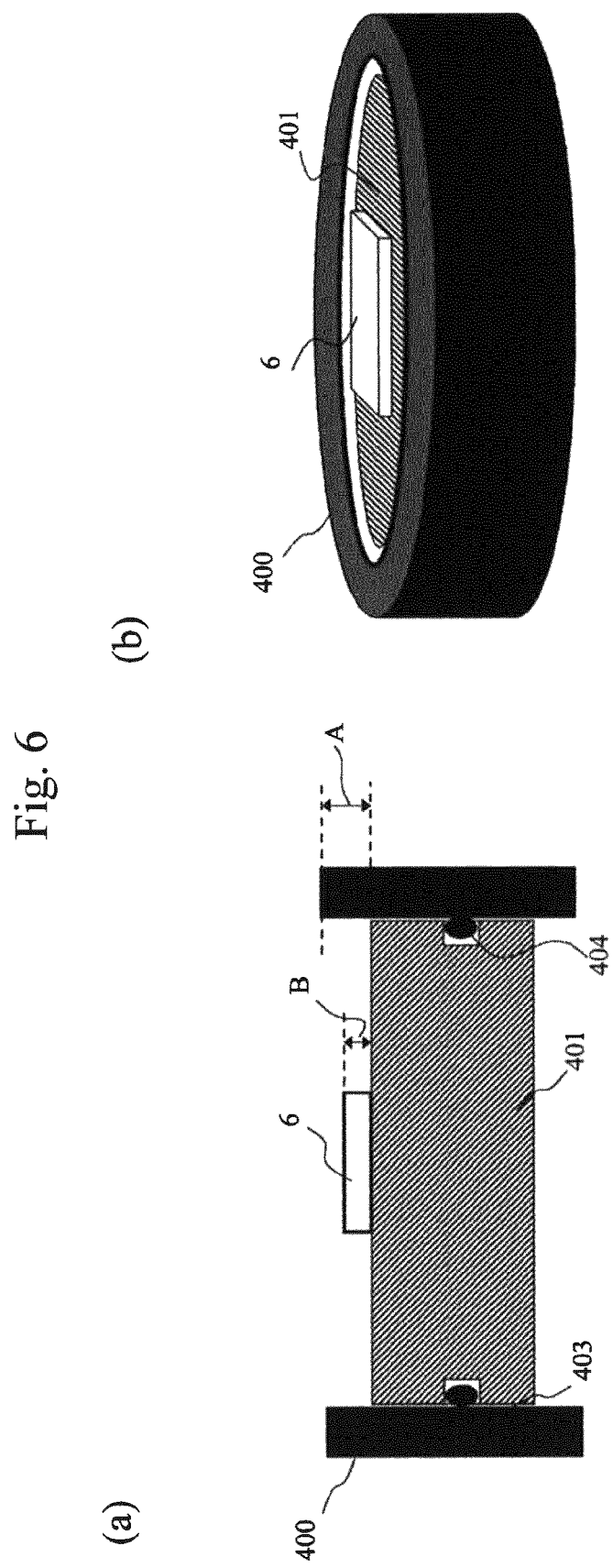
FIG. 6 describes a further contact prevention member.

FIG. 6 illustrates another example. FIG. 6(a) is a cross-sectional view of a side face, and FIG. 6(b) is a perspective view. In this way, the contact prevention member 400 may be disposed entirely on the outside of the sample base 401. In this case, the outer periphery of the sample base 401 may be a male screw, and the inside of the contact prevention member 400 may be a female screw, for example, so that the sample base 401 can be rotated with reference to the contact prevention member 400, whereby the contact prevention member 400 can be disposed at a position higher than that of the surface of the sample 6. In order not to generate displacement at the boundary 403 part due to screw loose, displacement prevention member 404 such as rubber may be disposed between the sample base 401 and the contact prevention member 400. In the case of this configuration, since the part of the contact prevention member 400 is large as compared with the case of FIG. 4 and the like, it has a feature of easy adjustment. Although not illustrated, a ball bearing 406 or a protrusion member may be added on the upper side of the contact prevention member 400 of FIG. 6, which belongs to the scope of the charged particle beam microscope of the present embodiment as long as they meet the functions intended for the present embodiment.

Figure 7:
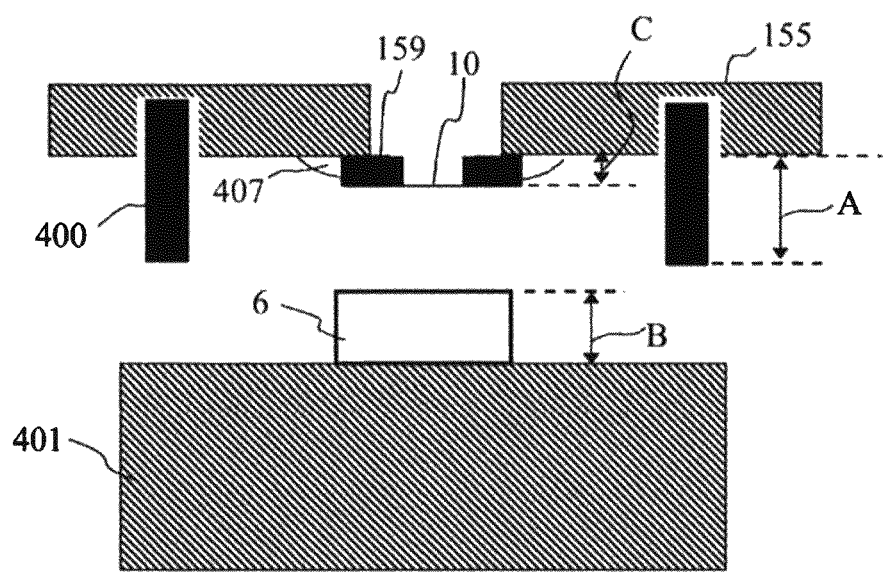
FIG. 7 describes a still further contact prevention member.

Alternatively, as illustrated in FIG. 7, the contact prevention member 400 may be provided at the diaphragm holding member 155. In this case, when the height of the sample base 401 changes, the contact prevention member 400 provided at the diaphragm holding member 155 will come into contact with the sample base 401. In this case, a typical flat sample base for charged particle microscopes that are commercially available can be used as it is.

Although not illustrated, detection means may be provided so as to detect the timing when the contact prevention member 400 comes into contact with the diaphragm holding member 155. Such detection means may be electrical detection means configured to be in a non-conducting state when the sample base 401 and the contact prevention member 400 are not in contact with the diaphragm holding member 155, and to be conductive when they come into contact. This may be mechanical detection means such that, when the sample base 401 and the contact prevention member 400 come into contact with the diaphragm holding member 155, one of these members have a mechanical switch.

The contact prevention member 400 may be removable. When the contact prevention member 400 interferes with a sample during the placing or replacing of the sample, the contact prevention member 400 may be removed once, and after placing the sample, the contact prevention member 400 may be attached again.

Embodiment 21

The present embodiment describes an exemplary application to a charged particle microscope. Specifically examples of the charged particle microscope include a scanning electron microscope and an ion microscope. In the following, the descriptions on parts similar to Embodiment 1 are omitted.

Figure 8:
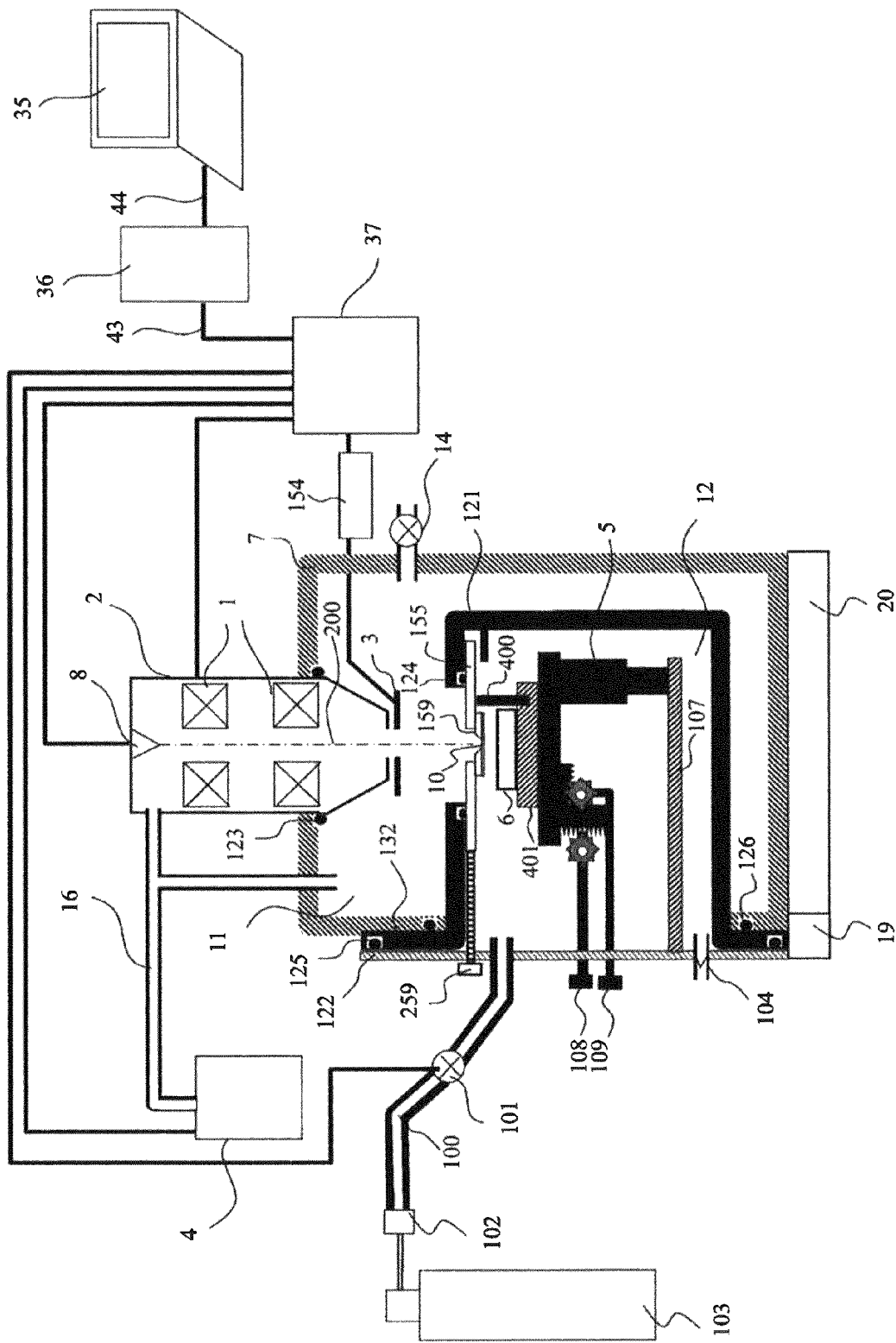
FIG. 8 illustrates the configuration of a charged particle microscope of Embodiment 2.

FIG. 8 illustrates the overall configuration of a charged particle microscope of the present embodiment. Similarly to Embodiment 1, the charged particle microscope of the present embodiment also includes a charged particle optic column 2, a first enclosure 7 (vacuum chamber) to support the charged particle optic column at the device installation face, a second enclosure 121 (attachment) that is inserted into the first enclosure 7 for use, a control system and the like. Since operations and functions of these elements and additional elements added to these elements are substantially similar to those of Embodiment 1, the detailed descriptions thereon are omitted.

The diaphragm holding member 155 is fixed removably on the side of the upper face of the second enclosure 121, specifically on the lower face side of a ceiling pate thereof via a vacuum sealing member. Since the diaphragm 10 is very thin of several nm to several tens μm or less because it has to let a charged particle beam pass therethrough, the diaphragm may be broken due to degradation over time or during preparation for observation. Due to such a thin diaphragm 10, it is very difficult to perform handling thereof directly. As in the present embodiment, handling of the diaphragm 10 can be performed not directly but via the diaphragm holding member 155, whereby the diaphragm 10 can be very easily handled (especially replaced). That is, if the diaphragm 10 is broken, it may be replaced together with the diaphragm holding member 155, and in case that the diaphragm 10 has to be replaced directly as well, the diaphragm holding member 155 can be taken out to the outside of the device and the diaphragm 10 can be replaced outside of the device. Similarly to Embodiment 1, an aperture member having a hole of 1 $mm^2$ or less in area may be used instead of the diaphragm.

The sample base 401 of the present embodiment is provided with the aforementioned contact prevention member 400 as well. The sample 6 can be removed to the outside of the device together with the sample base 401 and the contact prevention member 400.

The charged particle microscope of the present embodiment is configured so that at least one side face of the second space (open face of the second enclosure 121) can be covered with a. Rd member 122, whereby various functions can be implemented. The following describes them.

The charged particle microscope of the present embodiment is equipped with a function to supply replacement gas to the second enclosure. A charged particle beam emitted from the lower end of the charged particle optic column 2 travels in the first space 11 kept at high vacuum, passes through the diaphragm 10 (or aperture member) illustrated in FIG. 8 and then enters into the second space 12 kept at atmospheric pressure or in a desired pressure state or gas state. The atmosphere in the second space is at atmospheric pressure or a pressure similar to the atmospheric pressure, which is in the state having the degree of vacuum inferior to that of the first space at least (low-vacuum state). Since a charged particle beam is scattered by gas molecules in the space with low degree of vacuum, the mean free path thereof becomes shorter. That is, a large distance between the diaphragm 10 and the sample 6 leads to a failure of a charged particle beam or secondary electrons, reflected electrons or transmitted electrons generated by the irradiation of the charged particle beam to reach a sample or the detector 3. Meanwhile, the possibility of scattering of an electron beam is proportional to the mass number of the gas molecules. That is, replacement of the second space 12 with gas molecules having the mass number smaller than that of the air decreases the possibility of scattering of a charged particle beam, meaning that the charged particle beam can reach the sample. Instead of replacement of the entire second space, the air in at least the route along which an electron beam passes in the second space may be replaced with such gas. Types of the replacement gas may be gas lighter than air, such as nitrogen and water vapor, from which the effect of improving image S/N can be found, and helium gas and hydrogen gas lighter in mass have a large effect of improving image S/N.

For those reasons, the charged particle microscope of the present embodiment is provided with an attachment part of a gas supplying pipe 100 (gas introduction part) at the lid member 122. The gas supplying pipe 100 is jointed to a gas cylinder 103 via a joint part 102, whereby replacement gas is introduced into the second space 12. On the way of the gas supplying pipe 100, a gas control valve 101 is disposed to control the flow rate of the replacement gas flowing through the pipe. To this end, a signal line runs from the gas control valve 101 to the lower-level control unit 37, and so a user of the device can control the flow rate of the replacement gas using a manipulation screen that is displayed on the monitor of the computer 35. The gas control valve 101 may be closed/opened manually.

Since the replacement gas is light element gas, it tends to stay at the upper part of the second space 12, and so replacement is difficult on the lower side thereof. Then an opening for communication between the interior and the exterior of the second space may be provided on the lower side of the attachment position of the gas supplying pipe 100 at the lid member 122. For instance, an opening may be provided at the attachment position of a pressure regulation valve 104 in FIG. 6. This allows the air gas to be pushed by the light element gas introduced from the gas introduction part and to be discharged from the opening on the lower side, and so gas can be replaced in the second enclosure 121 effectively. Herein this opening may be used also as a rough evacuation port described later.

An evacuation port may be provided at the second enclosure 121 or at the lid member 122, and the interior of the second enclosure 121 may be once evacuated to be in a slight negative pressure state. Evacuation in this case may not be high-degree of evacuation and rough evacuation is enough because it is simply to reduce the component of atmospheric gas remaining in the second enclosure 121 to be a predetermined amount or less. Following the rough evacuation, gas may be introduced from the gas supplying pipe 100. The degree of vacuum may be $10^5$ Pa to $10^3$ Pa, for example. When gas is not introduced, the gas cylinder 103 may be replaced with a vacuum pump. In this case also, a slight negative-pressure state can be formed.

When a sample containing water, such as a biological sample, is to be observed, however, such a sample once placed in the vacuum state changes in state because the water therein evaporates. In such a case, it is preferable that replacement gas be introduced directly from the air atmosphere as stated above. Following the introduction of the replacement gas, the opening may be closed with the lid member, whereby replacement gas can be confined in the second space 12 effectively.

A three-way valve may be attached to the position of the opening, whereby this opening can be used as the rough evacuation port as well as the air leaking exhaust port. That is, one of the three-way valves may be attached to the lid member 122, another valve may be connected to the vacuum pump for rough evacuation, and a leak valve may be attached to the remaining valve, whereby such a two-way exhaust port can be made.

Instead of the opening, the pressure regulation valve 104 may be provided. Such a pressure regulation valve 104 has a function such that it automatically opens when the pressure of the interior of the second enclosure 121 exceeds 1 atmospheric pressure. Such a pressure regulation valve having the function can open automatically when the pressure of the interior exceeds 1 atmospheric pressure the introduction of light element gas, so as to discharge the atmospheric gas component such as nitrogen and oxygen to the outside of the device to fill the interior of the device with the light element gas. The illustrated gas cylinder 103 may be provided at the charged particle microscope, or the user of the device may attach it later.

In this way, according to the present embodiment, the degree of vacuum of the space to place a sample therein can be controlled to be any degree from the atmospheric pressure (about $10^5$ Pa) to about $10^3$ Pa. In the case of a conventional so-called low-vacuum scanning electron microscope, an electron beam column and a sample chamber are in communication with each other, and so when the degree of vacuum of the sample chamber is reduced to be a pressure closer to the atmospheric pressure, then the pressure in the electron beam column also will change correspondingly, and so it is difficult to control the pressure of the sample chamber to be pressure from the atmospheric pressure (about $10^5$ Pa) to about $10^3$ Pa. According to the present embodiment, since the second space and the first space are separated by a thin film, the pressure and the type of gas of the atmosphere in the second space surrounded with the second enclosure 121 and the lid member 122 can be controlled freely. That is, the pressure of the sample chamber can be controlled to be from the atmospheric pressure (about $10^5$ Pa) to about $10^3$ Pa, whereas it is difficult for the conventional device to control the pressure to be in this range. Further, observation of a sample becomes possible not only at the atmospheric pressure (about $10^5$ Pa) but also while changing the pressure to be a pressure closer to the atmospheric pressure steplessly.

The following describes a method to adjust the position of the sample 6. The charged particle microscope of the present embodiment includes a sample stage 5 as moving means of a field of view for observation. The sample stage 5 includes a XY driving mechanism in the in-plane direction and a Z-axis driving mechanism in the height direction. The lid member 122 is provided with a support plate 107 to be a bottom plate to support the sample stage 5, and the sample stage 5 is fixed to the support plate 107. The support plate 107 is attached to the lid member 122 at the opposed face to the second enclosure 121 so as to extend toward the interior of the second enclosure 121. From each of the Z-axis driving mechanism and the XY driving mechanism, a supporting shaft extends to be connected to a manipulation knob 108 and a manipulation knob 109, respectively. The user of the device can manipulate these manipulation knob 108 and manipulation knob 109 to adjust the position of the sample 6 in the second enclosure 121.

Figure 9:
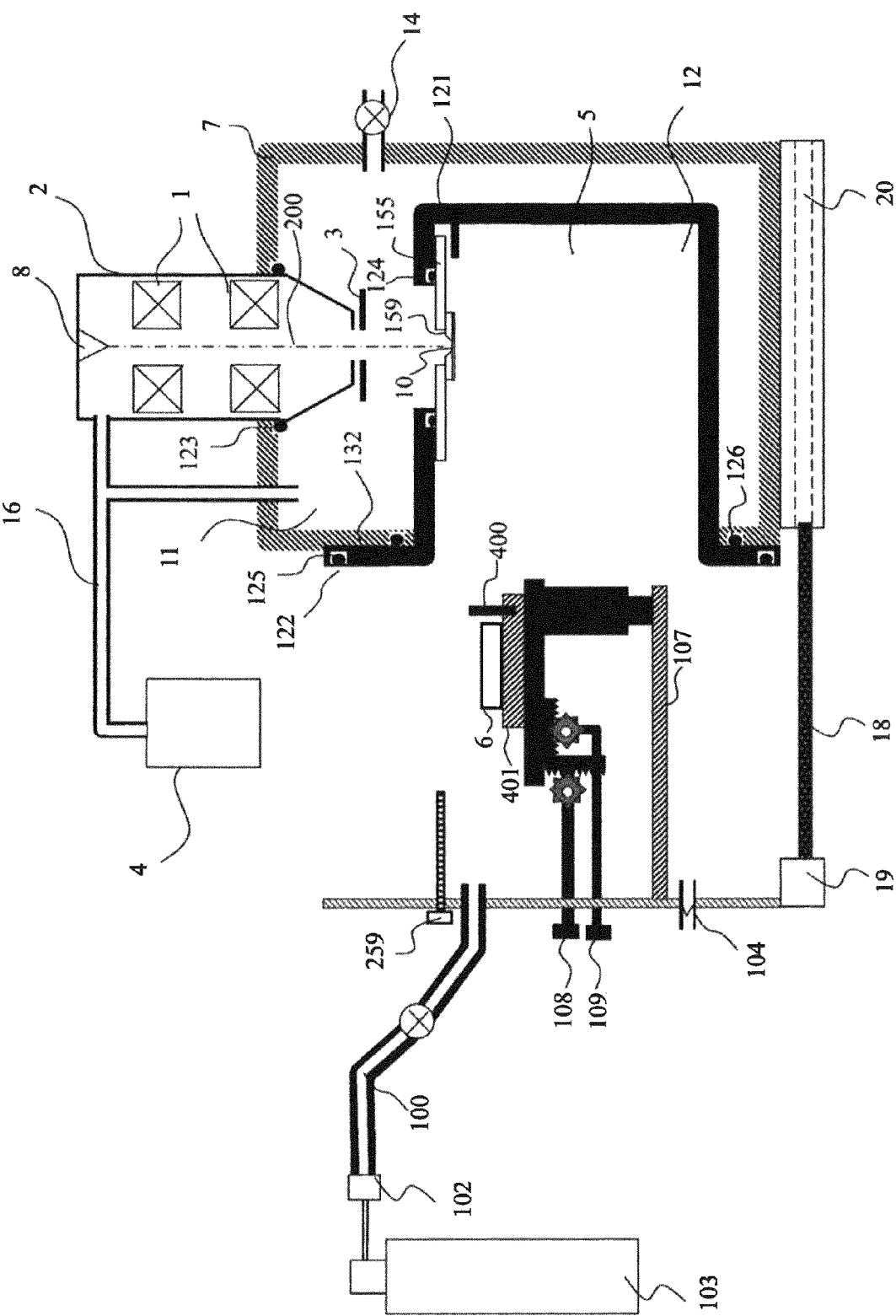
FIG. 9 illustrates the configuration of a charged particle microscope of Embodiment 2.

Next the following describes the mechanism to replace the sample 6. The charged particle microscope of the present embodiment is provided with a lid member supporting member 19 and a bottom plate 20 on the bottom face of the first enclosure 7 and the lower face of the lid member 122. The lid member 122 is fixed to the second enclosure 121 via a vacuum sealing member 125 to be removable. The lid member supporting member 19 also is fixed to the bottom plate 20 to be removable, and as illustrated in FIG. 9, the lid member 122 and the lid member supporting member 19 as a whole can be removed from the second enclosure 121. This drawing omits electrical wiring and the like.

The bottom plate 20 is provided with a support rod 18 to be used as a guide for the removable. The support rod 18 is configured to be stored in a storage part that is provided at the bottom plate 20 in the normal observation state, and to extend in the drawing direction of the lid member 122 for removal. At the same time, the support rod 18 is fixed to the lid member supporting member 19, and when the lid member 122 is removed from the second enclosure 121, it is configured so as not to separate the lid member 122 and the main body of the charged particle microscope completely. This can prevent the falling of the sample stage 5 or the sample 6.

When a sample is brought into the second enclosure 121, the Z-axis manipulation knob of the sample stage 5 is firstly rotated to move the sample 6 away from the diaphragm 10. Next, the pressure regulation valve 104 is opened to let the interior of the second enclosure open to the air. Thereafter, after confirming that the interior of the second enclosure is not in the reduced-pressure state or in an extremely pressurized state, the lid member 122 is pulled out in the direction opposite of the main body of the device. As a result, the device becomes in the ready state for replacement of the sample 6. After the replacement of a sample, the lid member 122 is pushed into the second enclosure 121, and the lid member 122 is fixed to the abutting part 132 with fastening member not illustrated. Then, replacement gas is introduced as needed. This manipulation can be executed when high voltage is applied to the optical lens 2 in the electron optic column 2 or when an electron beam is emitted from the charged particle beam source 8 as well. In this way, according to the charged particle microscope of the present embodiment, observation can be started immediately after sample replacement. This device also includes the contact prevention member 400 on the sample base 401 similarly to Embodiment 1. The sample 6 can be taken out from the device together with the sample base 401 and the contact prevention member 400.

Figure 10:
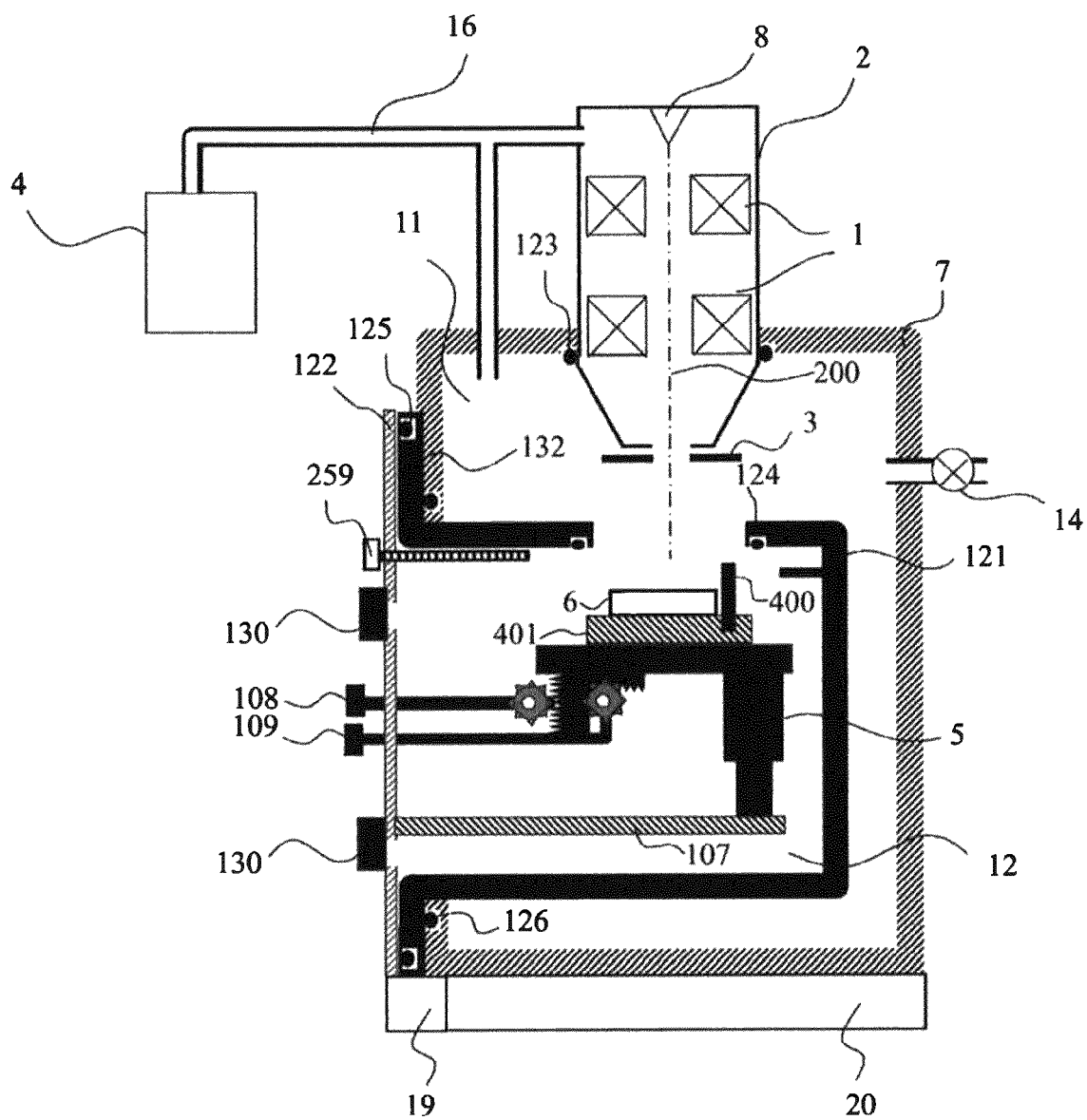
FIG. 10 illustrates the configuration of a charged particle microscope of Embodiment 2.

The charged particle microscope of the present embodiment can be used as a typical high-vacuum SEM as well. FIG. 10 illustrates the overall configuration of a charged particle microscope of the present embodiment when it is used as a high-vacuum SEM. FIG. 10 omits the control system because it is similar to that in FIG. 8. FIG. 10 illustrates the state of the charged particle microscope where, after removing the gas supplying pipe 100 and the pressure regulation valve 104 from the lid member 122 while keeping the lid member 122 fixed to the second enclosure 121, the attachment positions of the gas supplying pipe 100 and the pressure regulation valve 104 are blocked with lid members 130. Before and after this state, the diaphragm 10 and the diaphragm holding member 155 may be removed from the second enclosure 121, whereby the first space 11 and the second space 12 can be connected, and so the interior of the second enclosure can be evacuated with the vacuum pump 4. This enables observation with high-vacuum SEM in the state of the second enclosure 121 attached.

As described above, in the present embodiment, the sample stage 5, the manipulation knobs 108 and 109 thereof, the gas supplying pipe 100 and the pressure regulation valve 104 are all attached to the lid member 122 intensively. This allows the user of the device to perform the manipulation of these manipulation knobs 108 and 109, the replacement operation of a sample and the attachment/detachment operation of the gas supplying pipe 100 and the pressure regulation valve 104 at the same face of the first enclosure. In this way, compared with a charged particle microscope configured to these components attached to different faces of the sample chamber, the operability can be very improved for switching between the state for observation at atmospheric pressure and the state for observation under high vacuum.

In addition to the above-described configuration, a contact monitor may be provided so as to detect a contact state between the second enclosure 121 and the lid member 122, to monitor the opening or the closing of the second space.

In addition to the secondary electron detector or the reflected electron detector, an X-ray detector or a photodetector may be provided so as to enable EDS analysis and detection of fluorescence lines. The X-ray detector or the photodetector may be disposed at any of the first space 11 and the second space 12.

Voltage may be applied to the sample stage 5. Application of voltage to the sample 6 enables electrons emitted from the sample 6 and electrons transmitted to have high energy, and so the amount of signal therefrom can be increased and image S/N can be enhanced.

According to the present embodiment, in addition to the advantageous effects of Embodiment 1, a SEM can be configured that can be used as a high vacuum SEM and can facilitate the observation at the atmospheric pressure or in the gas atmosphere in a slight negative-pressure state. Further since observation can be executed while introducing replacement gas, the charged particle microscope of the present embodiment enables an image with better S/N than the charged particle microscope of Embodiment 1 to be acquired.

The present embodiment describes an exemplary configuration intended for a desktop type electron microscope, and the preset embodiment is applicable to a large-size charged particle microscope as well. In the case of a desktop type electron microscope, the device as a whole or the charged particle optic column is supported by an enclosure at the device installation plane. Meanwhile, in the case of a large-size charged particle microscope, the device as a whole may be placed on a base, and so the first enclosure 7 may be placed on the base, whereby the configuration described in the present embodiment as it is can be used for a large-size charged particle microscope.

Embodiment 3

Figure 11:
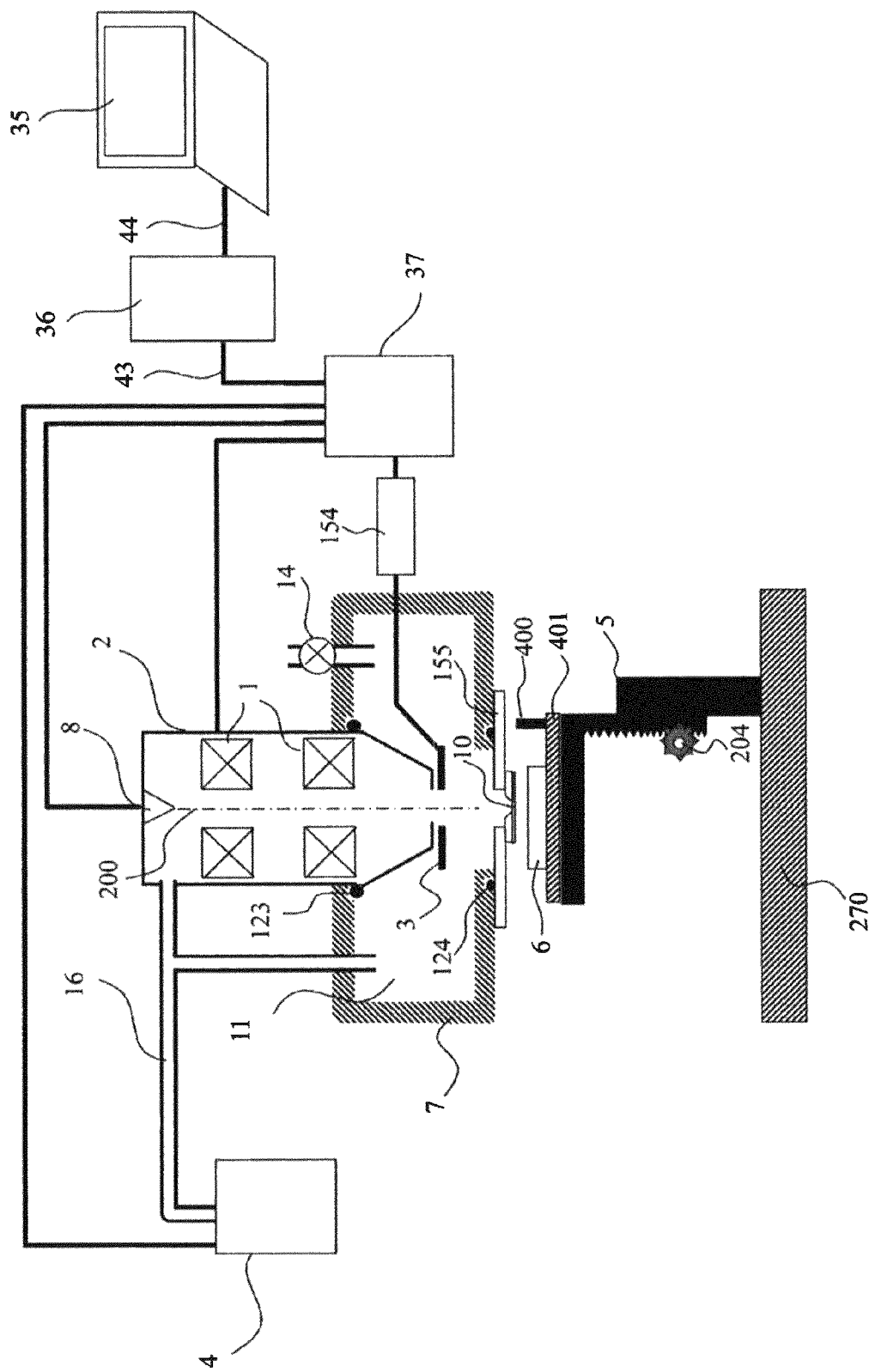
FIG. 11 illustrates the configuration of a charged particle microscope of Embodiment 3.

FIG. 11 illustrates Embodiment 3. The following omits the descriptions on parts similar to those in Embodiments 1 and 2.

The present embodiment includes an enclosure (vacuum chamber) 7 connected to a charged particle optic column 2 to support the charged particle optic column, a sample stage 5 disposed under the air atmosphere and a control system to control them. At a lower part of the enclosure (vacuum chamber) 7, a diaphragm 10 is disposed. During the operation of the charged particle microscope, the interior of the charged particle optic column 2 and the first enclosure are evacuated with the vacuum pump 4.

Below the diaphragm 10 provided at the enclosure 7, a sample stage 5 is provided, which is disposed under air atmosphere. The sample stage 5 is equipped with a height adjustment function capable of bringing the sample 6 closer to the diaphragm 10 at least. For instance, rotation of a manipulation part 204 can bring the sample 6 closer to the diaphragm 10. A XY driving mechanism also may be provided, which moves in the in-plane direction of the sample. This device also includes the contact prevention member 400 on the sample base 401 similarly to Embodiment 1 and Embodiment 2. The sample 6 can be taken out from the device together with the sample base 401 and the contact prevention member 400.

In the case of the configuration of the present device, a space to place a sample therein is a complete atmospheric space, and so a sample having a relatively large in size can be introduced for observation as compared with the aforementioned embodiments.

Embodiment 4

Figure 12:
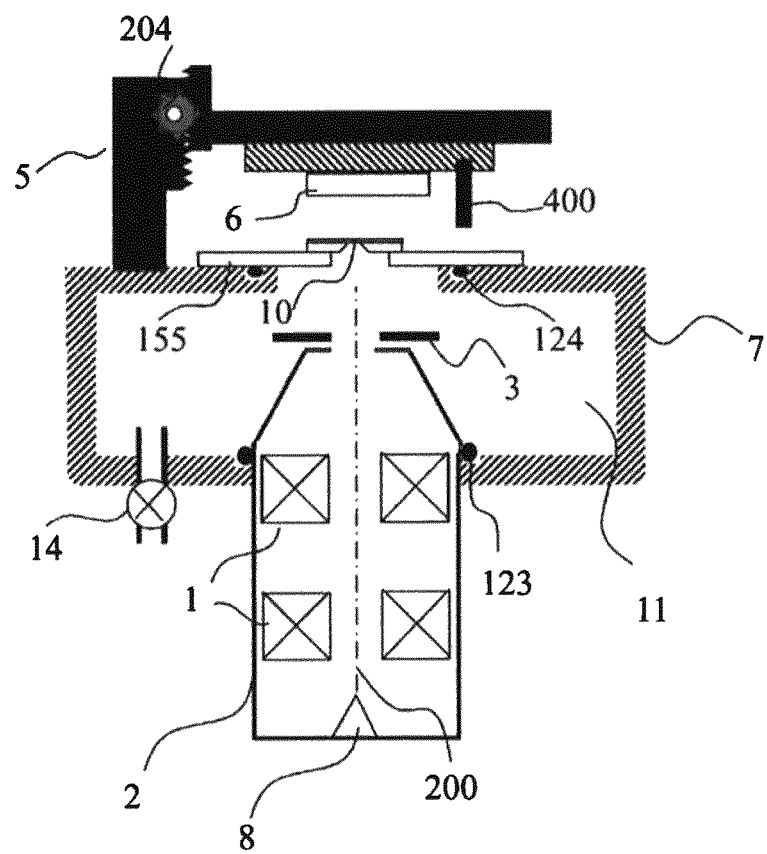
FIG. 12 illustrates the configuration of a charged particle microscope of Embodiment 4.

The present embodiment describes the configuration as a modification example of Embodiment 1, in which a charged particle optic column 2 is located below a diaphragm 10. FIG. 12 illustrates the configuration of a charged particle microscope of the present embodiment. The drawing omits a vacuum pump, a control system and the like. An enclosure 7 as a vacuum chamber and the charged particle optic column 2 are supported at the device installation face by a column or a support, for example. Since operations and functions of these elements and additional elements added to these elements are substantially similar to those of the embodiments stated above, the detailed descriptions thereon are omitted.

In order so that the sample 6 and the diaphragm 10 do not come into contact with each other, a sample stage 5 is disposed above the diaphragm. That is, the sample on the lower side of the sample 6 in the drawing will be observed. A manipulation part 204 to manipulate the sample stage 5 can be used to bring the lower-side face of the sample in the drawing closer to the diaphragm 10. Similarly to the embodiments stated above, the contact prevention member 400 is provided on the sample base 401, which can prevent a contact of the sample and the diaphragm and can control the distance.

The present invention is not limited to the above-described embodiments, and may include various modification examples. For instance, the entire detailed configuration of the embodiments described above for explanatory convenience is not always necessary for the present invention. A part of one embodiment may be replaced with the configuration of another embodiment, or the configuration of one embodiment may be added to the configuration of another embodiment. The configuration of each embodiment may additionally include another configuration, or a part of the configuration may be deleted or replaced. The above-described configurations, functions, processing parts, processing means and the like, a part or the entire of them, may be implemented by hardware by designing as an integrated circuit, for example. Alternatively, the above-described configurations, functions and the like may be implemented by software using a processor that interprets a program to implement these functions and executes the program.

Information such as programs, tables and files to implement these functions may be placed on a recording device such as a memory, a hard disk or a SSD (Solid State Drive), or a recording medium such as an IC card, a SD card or a DVD.

Control lines and information lines shown are those required for description, and all of the control line and information lines of a product are not always illustrated. It can be considered that in an actual product, almost all configurations are mutually connected.

REFERENCE SIGNS LIST

1 Optical lens
2 Electron optic (charged particle optic) column
3 Detector
4 Vacuum pump
5 Sample stage
6 Sample
7 First enclosure
8 Electron source (charged particle source)
9 Open face
10 Diaphragm
11 First space
12 Second space
14 Leak valve
16 Evacuation pipe
17 Sample base
18 Support rod
19 Lid member supporting member
20 Bottom plate
35 Computer
36 Upper-level control unit
37 Lower-level control unit
43, 44 Communication line
100 Gas supplying pipe
101 Gas control valve
102 Joint part
103 Gas cylinder
104 Pressure regulation valve
105 Limiting member
106 Camera
107 Support plate
108, 109 Manipulation knob
121 Second enclosure
122, 130 Lid member
123, 124, 125, 126, 128, 129 Vacuum sealing member
131 Main body part
132 Abutting part
152 Signal amplifier
155 Diaphragm holding member
156, 157, 158 Signal line
159 Primary charged particle beam
165 Tapered part
400 Contact prevention member
401 Sample base
402 Female screw
403 Boundary
404 Slip prevention member
405 Contact prevention member
406 Ball bearing
407 Vacuum sealing member

The invention claimed is:

1. A charged particle beam device, comprising a charged particle optic column configured to apply a primary charged particle beam on a sample, and a vacuum pump, comprising:
   an enclosure that makes up a part of the charged particle beam device, interior of the enclosure being evacuated with the vacuum pump;
   a diaphragm configured to separate a space to place the sample therein so that pressure of the space to place the sample therein is kept larger than pressure of the interior of the enclosure, the diaphragm letting the primary charged particle beam transmit or pass therethrough and being removable;
   a contact prevention member configured to prevent a contact between the sample and the diaphragm; and
   an adjustment mechanism configured to let a position of the contact prevention member that comes into contact with a sample base to hold the sample or a member to hold the diaphragm movable in a direction of an optical axis of the charged particle optic column.

2. The charged particle beam device according to claim 1, further comprising:
   a first enclosure that makes up a part of the charged particle beam device, interior of the first enclosure being evacuated with the vacuum pump; and
   a second enclosure whose position is fixed to a side face or an inner wall face of the first enclosure, or to the charged particle optic column, the second enclosure being configured to store the sample therein;
   wherein
   the diaphragm is disposed on an upper face side of the second enclosure, and
   pressure of interior of the second enclosure is kept at a pressure equal to pressure of interior of the first enclosure, or pressure of interior of the second enclosure is kept in a state higher than pressure of interior of the first enclosure.

3. The charged particle beam device according to claim 1, wherein
   the contact prevention member is provided at a sample base to hold the sample or at a member to hold the diaphragm.

4. The charged particle beam device according to claim 1, wherein
   the contact prevention member includes a fine adjustment member, and
   the contact prevention member comes into contact with a sample base to hold the sample or a member to hold the diaphragm via the fine adjustment member, whereby the sample base can be driven in the direction orthogonal to the optical axis of the charged particle optic column while keeping a distance between the sample base and the member to hold the diaphragm constant by the contact prevention member.

5. The charged particle beam device according to claim 4, wherein
the fine adjustment member comprises a ball bearing.

6. The charged particle beam device according to claim 1, further comprising detection means that detects a contact of the contact prevention member to a member to hold the diaphragm.

7. The charged particle beam device according to claim 2, further comprising a lid member that is disposed so as to define at least one side face of the space to place the sample therein, wherein
the lid member is provided with a sample stage to change the sample in position.

8. The charged particle beam device according to claim 1, further comprising a gas introduction outlet capable of setting the space to place the sample therein to have desired gas atmosphere and a desired pressure.

9. A sample observation method that applies a primary charged particle beam to a sample for observation in a state where a space to place the sample therein is separated by a removable diaphragm of letting the primary charged particle beam transmit or pass therethrough so that pressure of the space to place the sample therein is kept larger than pressure of interior of the charged particle optic column, comprising the steps of:
adjusting a height of a contact prevention member with reference to a surface of the sample, the contact prevention member being configured to prevent a contact of the sample with the diaphragm;
disposing the sample immediately below the diaphragm;
bringing the sample disposed immediately below the diaphragm closer to the diaphragm by moving the sample in a direction of an optical axis of the charged particle optic column;
keeping a distance from the diaphragm to the surface of the sample constant with the contact prevention member; and
applying the primary charged particle beam to the sample in a state where the sample and the diaphragm are not in contact with each other.

10. The sample observation method according to claim 9, wherein the contact prevention member is brought into contact with a sample base to hold the sample or a member to hold the diaphragm, whereby a distance from the diaphragm to the surface of the sample is kept constant.

11. The sample observation method according to claim 9, further comprising the step of: driving the sample in a direction orthogonal to the optical axis of the charged particle optic column while keeping the distance from the diaphragm to the surface of the sample constant.

12. The charged particle beam device according to claim 1, wherein the contact prevention member comes into contact with the sample base to hold the sample and the member to hold the diaphragm at a plurality of points.

13. The sample observation method according to claim 9, wherein the contact prevention member comes into contact with a sample base to hold the sample and a member to hold the diaphragm at a plurality of points, thus keeping a distance from the diaphragm to the surface of the sample constant.

14. The charged particle beam device according to claim 1, wherein the contact prevention member is disposed so as to surround the sample base to hold the sample.

15. The sample observation method according to claim 9, wherein the contact prevention member is disposed so as to surround a sample base to hold the sample.

16. The charged particle beam device, according to claim 4, wherein a position of the fine adjustment member that comes into contact with the sample base to hold the sample and the member to hold the diaphragm is movable in a plane orthogonal to the optical axis of the charged particle optic column.

17. The sample observation method according to claim 11, wherein the contact prevention member comes into contact with a sample base to hold the sample or a member to hold the diaphragm via a fine adjustment member, and
a position of the fine adjustment member that comes into contact with the sample base to hold the sample and the member to hold the diaphragm is movable in a plane orthogonal to the optical axis of the charged particle optic column.

* * * * *